United States Patent
Hsu et al.

(10) Patent No.: US 7,093,171 B2
(45) Date of Patent: Aug. 15, 2006

(54) FLEXIBLE ROW REDUNDANCY SYSTEM

(75) Inventors: Louis L. Hsu, Fish Kill, NY (US);
Gregory J. Fredeman, Staatsburg, NY (US); Rajiv V. Joshi, Yorktown Heights, NY (US); Toshiaki Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 464 days.

(21) Appl. No.: 10/115,348

(22) Filed: Apr. 3, 2002

(65) Prior Publication Data
US 2003/0191991 A1 Oct. 9, 2003

(51) Int. Cl.
*G11C 29/00* (2006.01)
(52) U.S. Cl. ........................ 714/711; 714/723
(58) Field of Classification Search ................ 714/711, 714/710, 723

See application file for complete search history.

(56) References Cited

U.S. PATENT DOCUMENTS

| | | | | |
|---|---|---|---|---|
| 5,430,679 A | * | 7/1995 | Hiltebeitel et al. | 365/200 |
| 5,455,834 A | * | 10/1995 | Chang et al. | 714/768 |
| 5,859,801 A | * | 1/1999 | Poechmueller | 365/200 |
| 5,978,291 A | * | 11/1999 | Kirihata | 365/200 |
| 6,181,614 B1 | * | 1/2001 | Aipperspach et al. | 365/200 |

\* cited by examiner

*Primary Examiner*—Joseph Torres
(74) *Attorney, Agent, or Firm*—Satheesh K. Karra, Esq.

(57) ABSTRACT

A row redundancy system is provided for replacing faulty wordlines of a memory array having a plurality of banks. The row redundancy system includes a remote fuse bay storing at least one faulty address corresponding to a faulty wordline of the memory array; a row fuse array for storing row fuse information corresponding to at least one bank of the memory array; and a copy logic module for copying at least one faulty address stored in the remote fuse bay into the row fuse array; the copy logic module is programmed to copy the at least one faulty address into the row fuse information stored in the row fuse array corresponding to a predetermined number of banks in accordance with a selectable repair field size.

15 Claims, 7 Drawing Sheets

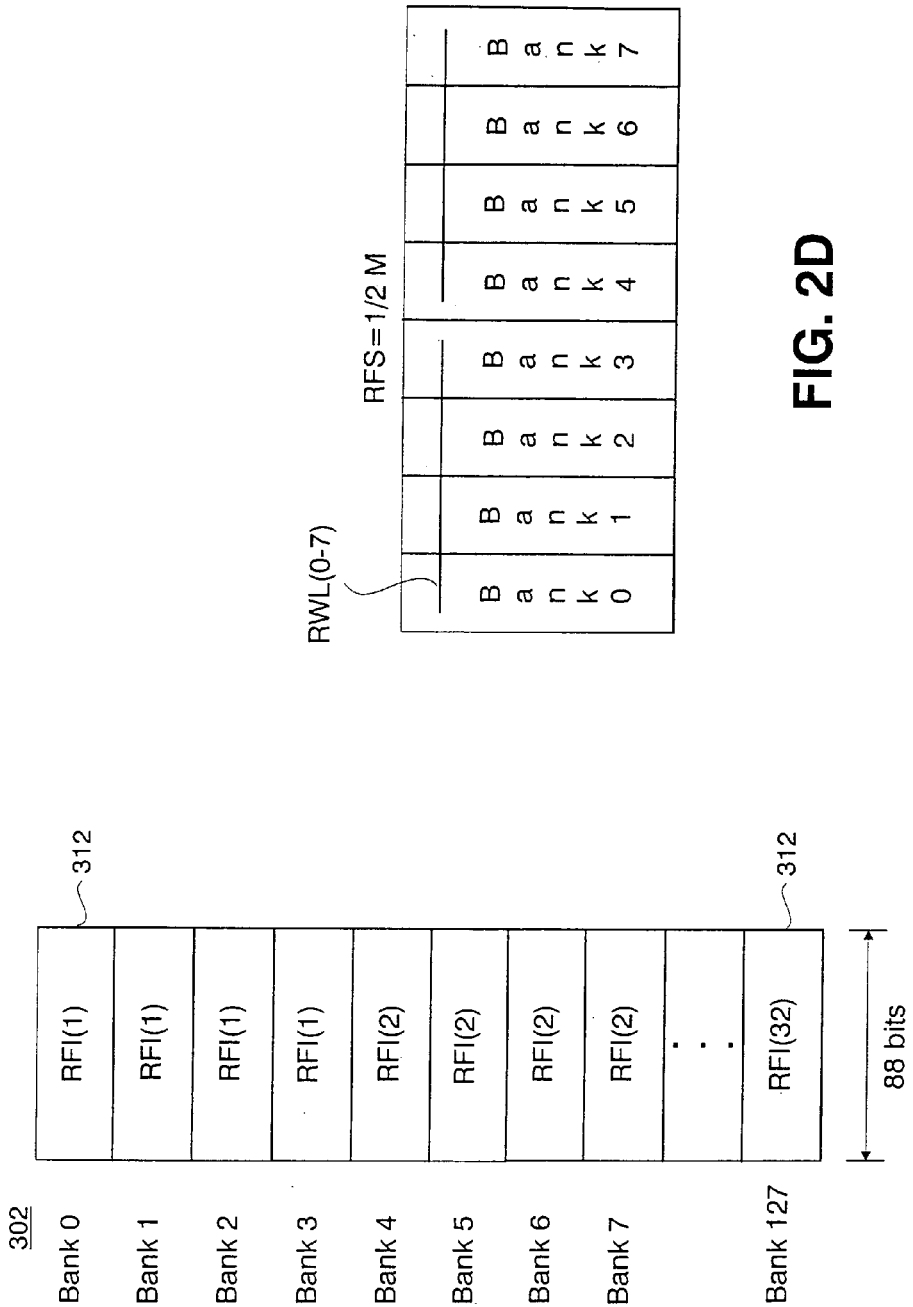

FLEXIBLE ROW REDUNDANCY SYSTEM

FIELD OF THE INVENTION

The present invention relates to integrated circuit design, and more specifically, to a flexible row redundancy system for a memory chip which increases the repairability of the memory chip with a minimal increase in chip size.

BACKGROUND OF THE INVENTION

Increased repairability of a memory array typically means more hardware, such as redundancy circuits, fuses and register elements, is required. This increase in hardware components also means an increase in chip size to accommodate these components. However, in the early design phase, especially when a new memory design and/or technology is still in its development stage, increased repairability of a memory array leads to not only the higher yield of the memory chip, but also an environment for debugging for future design or technology improvement.

Today's high-density memories, especially dynamic random access memory (DRAM) macro, embedded or not, comprise many sub-arrays called banks. Each bank comprises numerous smaller memory units called blocks or micro-cells. FIGS. 1A–B show prior art row redundancy storage 10 and a repair field region of a memory array, each having a fixed repair field size (RFS) of 1M (eight banks), respectively, of a prior art row redundancy system. In FIG. 1A, the row redundancy storage 10 is shown having storage cells 12 addressed as Bank0–127 storing redundancy information RI(1–16) corresponding, respectively, to 128 banks of the memory array.

In this case, 16 different sets of redundancy information RI(1–16) are stored, where each set of redundancy information corresponds to a repair field of 8 banks. As shown in FIG. 1A, one copy of each set of RI(n) is stored. Each set of RI(n) corresponds to one repair field, i.e., RI(1) corresponds to Banks0–7, RI(2) corresponds to Banks8–15, RI(16) corresponds to Banks120–127, etc.

Each set of redundancy information RI(n), includes 8 sets of 11 bits (or 88 bits). Each set of 11 bits represents a defective row address. Each defective row address indicates an address of a detected defective wordline. Eight redundant wordlines (RWL) are available for replacing defective wordlines detected in each repair field.

With reference to FIG. 1B, the repair field shown includes a set of eight banks, Bank0–7 forming a 1-megabyte (M) region. Each bank is traversed by 1,024 parallel wordlines WL(m), where m=0–1023, and 8 parallel redundant wordlines RWL(n), where n=0–7. Redundant wordlines RWL (0–7) are provided for replacing up to 8 possible failed wordlines of the wordlines WL(0–1023) within a bank. The redundant wordlines may be located anywhere within the bank however, typically, the row redundancy wordlines RWL(0–7) are located at the same location for each bank. In the example of FIG. 1B, the row redundancy wordlines RWL(0–7) are shown placed at the top portion of the bank.

A repair field size is defined as the minimal array size where repairing is done by the same set of given redundancy wordlines RWL(0–7). In FIG. 1B, the repair field size of row repair is 1M. When a wordline WL(m) is found to be defective within a bank, all the wordlines WL(m) across all eight banks (or the 1M region) within the repair field size are replaced by one redundancy wordline RWL(n), regardless of whether these wordlines WL(m) are defective or not. In the prior art example shown in FIG. 1B, only eight defective wordlines WL(m) with eight different row addresses are allowed in the whole 1M region. If more than eight wordlines WL(m) fail, the chip housing the 1M region is determined to be irreparable and must be discarded. In the prior art, the repairability of a memory chip is fixed, and once the RFS is defined in the design stage, it cannot be changed thereafter.

In the design stage, the repairability may be increased in order to improve yield. However, larger components are needed to accommodate increased repairability. For example, the size of an off-chip fuse bank used to store failed row information (row fuse information) discovered during a testing mode is proportional to the degree of repairability. Thus, the size of the fuse bank limits the degree of repairability of failed (faulty) wordlines WL(m).

Generally, the row redundancy is designed with the limited and inflexible repairability described above with reference to FIGS. 1A and 1B, which is sufficient once the technology has reached a mature stage, since the defect density becomes better controlled and the limited repairability is sufficient to get reasonable yield. Depending on the development stage of the memory design and/or related technology, different degrees of repairability may be desired. Greater repairability is typically desired at early stages of development, requiring a longer testing period and a larger storage area. Once the technology has reached a mature stage, it may be desirable to reduce the repairability in order to reduce the testing period and required storage area.

Accordingly, a need exists for a system and a method for selectably increasing repairability of a memory chip with a minimal increase in the size of circuitry associated with wordline repair. A need further exists for a system and method for flexible selection of repair field size.

SUMMARY

It is an aspect of the present invention to provide a system and a method for selectably increasing repairability of a memory chip with a minimal increase in the size of circuitry associated with wordline repair.

It is a further aspect of the present invention to provide a system and method for flexible selection of repair field size. Finally, it is an aspect of the present invention to provide a system and method for programmable selection of repair field size.

Accordingly, the present invention provides a row redundancy system for replacing faulty wordlines of a memory array having a plurality of banks. The row redundancy system includes a remote fuse bay storing at least one faulty address corresponding to a faulty wordline of the memory array; a row fuse array for storing row fuse information corresponding to at least one bank of the memory array; and a copy logic module for copying at least one faulty address stored in the remote fuse bay into the row fuse array; wherein the copy logic module is programmed to copy the at least one faulty address into the row fuse information stored in the row fuse array corresponding to a predetermined number of banks in accordance with a selectable repair field size.

Furthermore, the present invention provides a method for replacing faulty wordlines of a memory array including the steps of: selecting a repair field size; storing at least one faulty address into a first memory; and copying the stored at least one faulty address from the first memory into a variable number of storage cells of a second memory, wherein each storage cell of said second memory corresponds to a respective bank of said plurality of banks; and wherein the variable number of storage cells is in accordance with the selected repair field size.

BRIEF DESCRIPTION OF THE FIGURES

FIG. 2C is a block diagram of a row fuse array having a ½M repair field in the row redundancy system in accordance with the present invention;

FIG. 2D is a block diagram of a 1M region of a memory array having a ½M repair field region, of the row redundancy system of FIG. 2C;

DETAILED DESCRIPTION OF THE INVENTION

Figure 3:
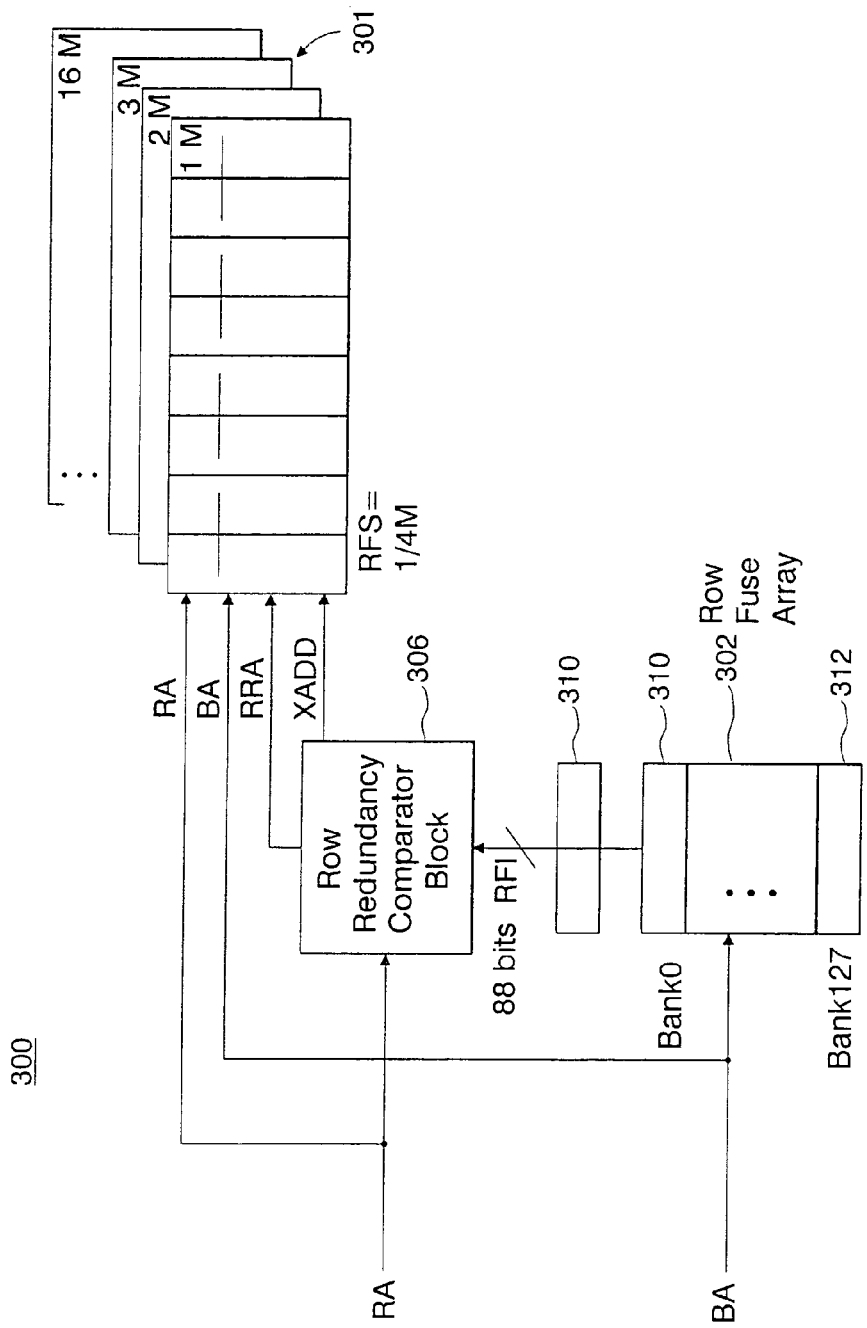
FIG. 3 is a block diagram of a row redundancy circuit of a memory system in accordance with the present invention.

With reference to FIG. 3, there is shown an exemplary row redundancy circuit for a memory system in accordance with the present invention. The inventive row redundancy circuit significantly increases flexibility and optimizes repairability without a significant increase in size relative to a conventional row redundancy circuit. Furthermore, the inventive row redundancy circuit may be implemented in conjunction with components associated with a conventional row redundancy circuit, such as an error correction code (ECC) block for detecting and correcting soft error of fuse information stored in a fuse register array.

As illustrated in FIG. 3, the present invention provides a row redundancy circuit 300 for performing redundancy repairs for memory array 301. The row redundancy circuit 300 includes a row fuse array 302, a row redundancy comparator block (RRCB) 306 and preferably an ECC circuit block 310. The row fuse array 302 is preferably an SRAM array. Each SRAM cell, such as a 6-transistor SRAM cell, of the SRAM array is significantly smaller than a scannable fuse latch of a conventional fuse register array. Thus, an SRAM array having a size similar to the size of a conventional fuse register array typically provides four times the amount of storage. The row fuse array 302 may alternatively be a different storage element such as flash memory, DRAM, a Ferro-electric RAM (FRAM), etc. The row fuse array 302 includes a storage cell 312 for storing row redundancy information, also referred to as row fuse information (RFI) corresponding to each bank0–127 of memory array 301.

Prior to, or during, testing of the memory array 301, a repair field size is selected. When multiple memory arrays 301 are tested, different repair field sizes may be selected. Furthermore, different repair filed sizes may be selected within one memory array 301. The selection of the repair field size may be determined in accordance with results of the testing. For example, an initial repair field size may be selected prior to testing, and then modified during testing in accordance with the testing results, or alternatively the testing process may be repeated with the modified repair field size.

During a testing mode each repair field of the memory array 301 is tested for faulty wordlines WL(m). Unique data corresponding to each repair field, e.g., the addresses of the detected faulty wordlines, is stored in a remote fuse bay that is typically located off of the chip housing the memory array 301.

During power on the stored data is scanned from the remote fuse bay into the row fuse array 302, and stored in the row fuse array 302 as row fuse information (RFI) using copy logic. Copy logic is known in the art for copying specified information a predetermined number of times and storing the copied information in a specified location. In the present invention the copy logic is used to copy the RFI corresponding to each repair field a predetermined number of times according to the repair field size of each repair field, and to store the copied RFI in the storage cells 312 of the row fuse array 302 corresponding to the banks of each repair field.

A conventional row fuse array generally includes a plurality of relatively large sized scannable fuse latches. The size of the scannable fuse latches is relatively large, and thus the resulting row fuse array is relatively bulky. Replacing the conventional row fuse array with a row fuse array formed using an SRAM array increases the storage capacity of the row fuse array without increasing the size of the row fuse array. The extra storage capacity (128 storage cells) and selection of the repair field size(s) provides flexibility in repairability of the memory array 301 using one standard design.

Figure 1B:
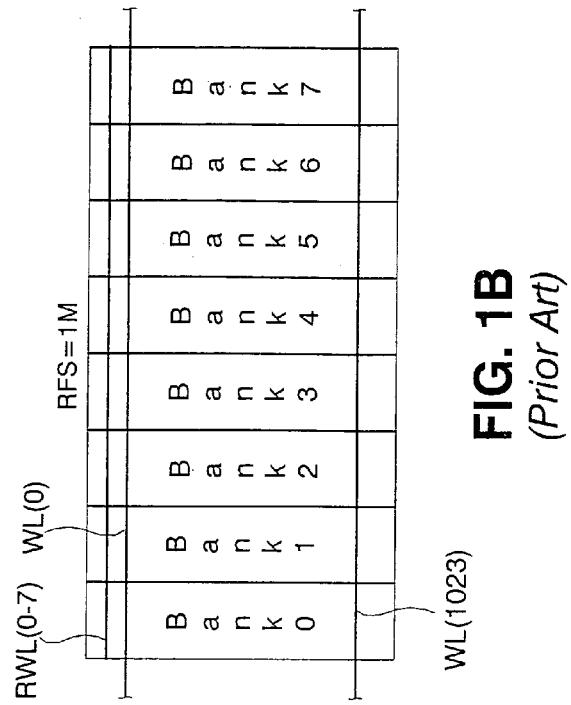
FIG. 1B is a block diagram of a 1M repair field region of a memory array of the prior art row redundancy system of FIG. 1A.
Figure 1A:
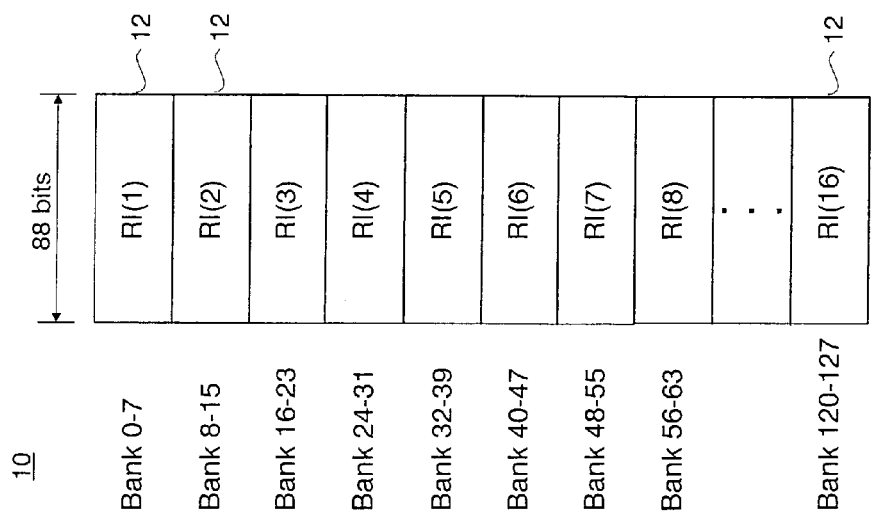
FIG. 1A is a block diagram of row redundancy storage in a prior art row redundancy system.
Figures 2A, 2B:
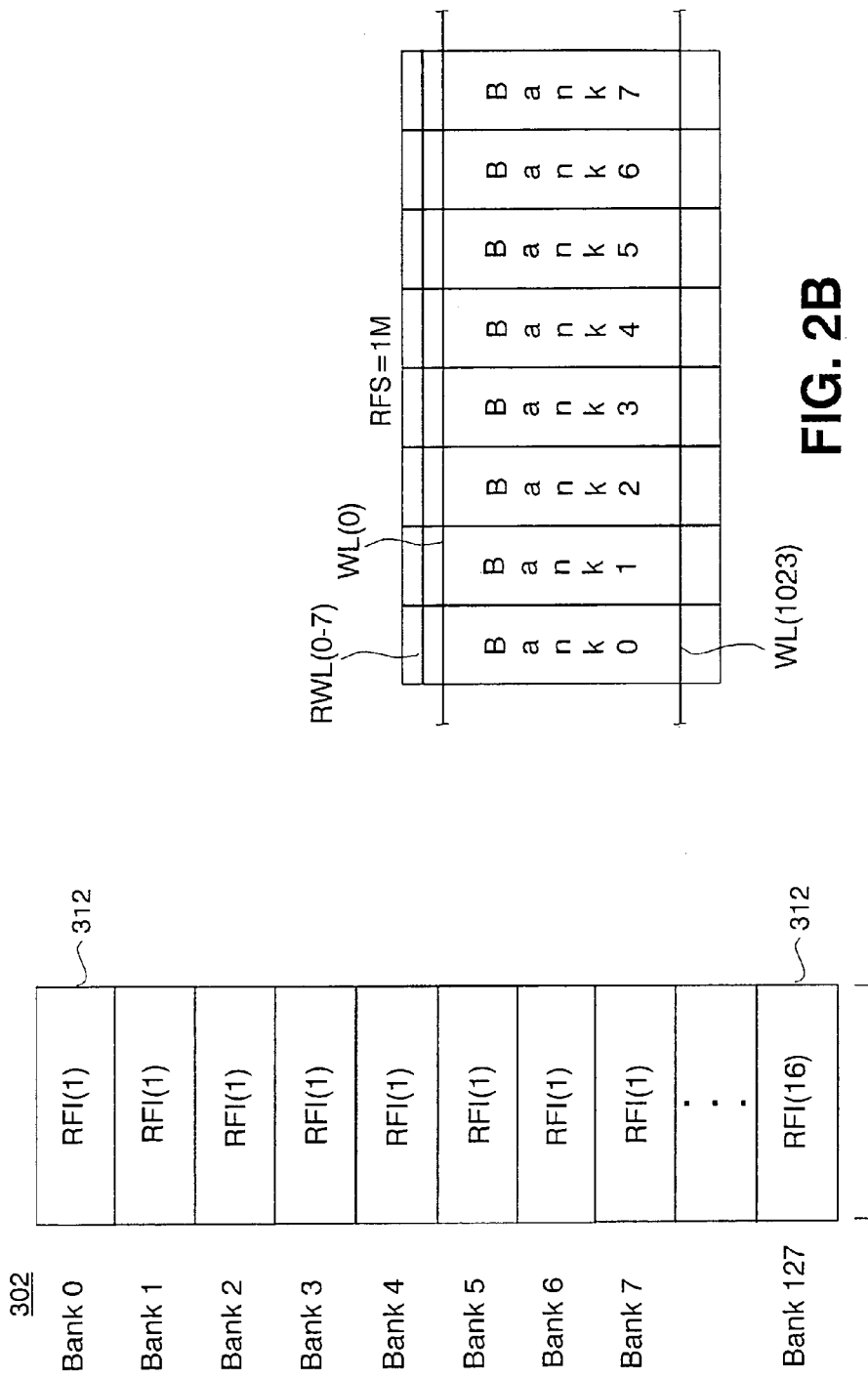
FIG. 2A is a block diagram of a row fuse array having a 1M repair field in a row redundancy system in accordance with the present invention.
FIG. 2B is a block diagram of a 1M region of a memory array having a 1M repair field region of the row redundancy system of FIG. 2A.

Selection of different repair field sizes is shown with reference to FIGS. 2A–F. Referring first to FIGS. 2A and 2B, the row fuse array 302 and a 1M region of the memory array 301 is shown, respectively, where the repair field size is 1M. Eight redundant wordlines RWL(0–7) are provided for each 1M region, having 8 banks, of the memory array 301. For each RWL(0–7), 10 bits are used for addressing the 1024 wordlines WL(0-1023) and another bit is used for a master fuse bit, totaling 11 bits. In total, 88 bits of RFI are used for each set of eight redundant wordlines RWL(0–7).

As shown in FIG. 2B, RFI(1) (88 bits of row fuse information associated with the first repair field) are copied and stored in the first eight storage cells 312 corresponding to Bank0 to Bank7, since Bank0 to Bank7 are in the repair field associated with RFI(1). Likewise each set of RFI(n), for n=2–16, is copied and stored in the eight storage cells 312 corresponding to the eight banks included in the repair field associated with the RFI(n). As seen in FIGS. 2A and 2B, a unique set of 88 bits of RFI, (e.g. RFI(1)–RFI(16)), is associated with each 1M repair field, in accordance with the selected RFS of 1M.

FIGS. 2C and 2D, show the row fuse array 302 and a 1M region of the memory array 301, respectively, where the repair field size is reduced to ½M. Two repair fields are shown in the 1M region. Eight redundant wordlines RWL (0–7) are provided for each ½M repair field region consisting of 4 banks. During testing, a unique set of 88 bits of RFI associated with each repair field are stored in the remote fuse bay (twice the amount of RFI stored in the prior art). During power-on each set of RFI(n), for n=2–32, is copied and stored in the four storage cells 312 corresponding to the four banks included in the ½M repair field associated with the RFI(n).

Figures 2E, 2F:
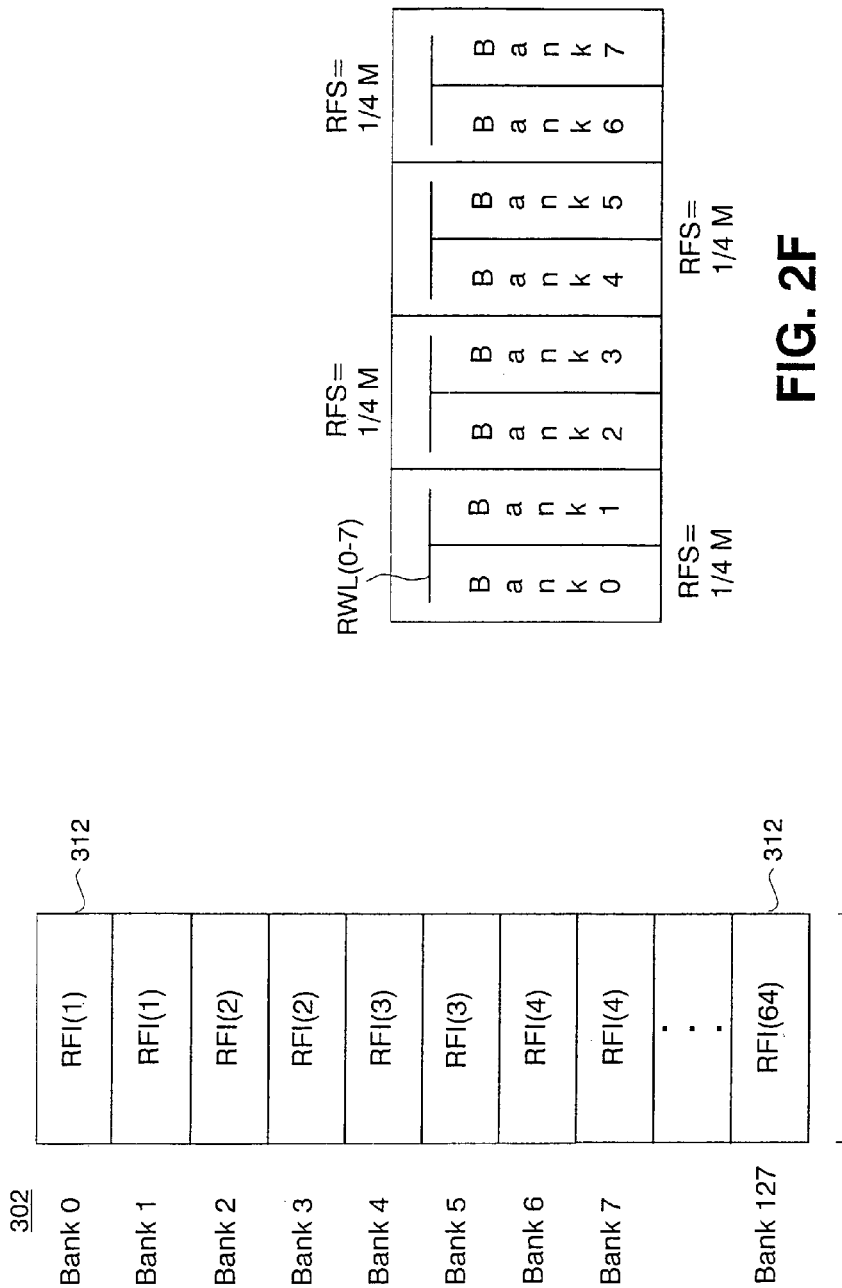
FIG. 2E is a block diagram of a row fuse array having a ¼M repair field in the row redundancy system in accordance with the present invention.
FIG. 2F is a block diagram of a 1M region of a memory array having a ¼M repair field region, of the row redundancy system of FIG. 2E.

FIGS. 2E and 2F show the row fuse array 302 and a 1M region of the memory array 301, respectively, where the repair field size is reduced to ¼M. Four repair fields are shown in the 1M region. Eight redundant wordlines RWL (0–7) are provided for each ¼M M repair field region consisting of 2 banks. During testing, a unique set of 88 bits of RFI associated with each repair field are stored in the remote fuse bay (four times the amount of RFI stored in the prior art). During power-on each set of RFI(n), for n=2–64, is copied and stored in the two storage cells 312 corresponding to the two banks included in the ¼M repair field associated with the RFI(n).

In the example shown, the repair field size may be selected to be 1M, ½M, ¼M. The repair field size may also be selected to be ⅛M. As the repair field size is reduced, repairability, and thus yield, of the memory array is increased. Selection of the repair field size provides flexibility in repairability, which is found to be useful, particularly when the design or technology of the memory is still at its developing stage.

When the row fuse array 302 is implemented in a dense memory such as SRAM, it is possible to accommodate storage of additional data in the row fuse array 302 without increasing the size of the row redundancy circuit. For example, the SRAM may provide temporary storage during test mode for storing defective row addresses for performing redundancy allocation calculations, thus reducing test time. In another example, if it is determined that one array or bank yields better than another array or bank, the RFS may be increased accordingly for that array or bank. Increased fuse storage provided by using an SRAM promotes flexible repairing and optimizes the yield of the chip by optimizing the repairability of each array.

It is to be understood that the memory array size, the bank size and the number of banks per array may vary according to design choice. Similarly, the repair field size selections may vary according to design choice.

Referring again to FIG. 3, the operation of the row redundancy circuit 300 will be discussed. As an incoming address, which includes row address (RA) and bank address (BA), is received by a memory array 301, the incoming RA is provided to the RRCB 306, and the incoming BA is provided to the row fuse array 302. The memory array 301 includes 128 banks arranged in 16 1M blocks. The RA includes ten bits for addressing a wordline of WL(0–1023) traversing each bank of the memory array, and the BA includes 7 bits for addressing a bank of banks0–127 of the memory array 301.

The BA is decoded for obtaining RFI stored in the storage cell 312 corresponding to the bank addressed by the BA. As described above, the RFI includes 88 bits of redundancy information including addresses of up to eight faulty wordlines. The RFI is provided to the ECC circuit block 310 for detecting and correcting soft-error for insuring integrity of the stored RFI. Soft-error is caused by radiation, and can cause data loss. The presence and degree of soft-error depends on the size of the SRAM array used for implementing the row fuse array 302, the technology used and the design of SRAM cells in the SRAM array.

The RA provided to the RRCB 306 is compared to the RFI for determining if the wordline WL(m) addressed by the RA matches with a defective wordline of the up to eight defective wordlines replaced by the RWLs(0–7). If a match is detected by the RRCB 306, the wordline WL(m) is defective. A control signal XADD and a redundant row address (RRA) is generated and provided to the memory array 301. The RRA includes three bits for addressing one of the eight RWLs(0–7). If a match is not detected the RA is decoded for addressing the desired row in the memory array 301.

In the example shown in FIG. 3, the repair field size is selected to be ¼M, as per defined during a test mode by a redundancy allocation algorithm. Once the repair field size is defined, the repair field size is transparent during operation of the memory array 301, without requiring additional hardware or incurring additional delays. Furthermore, the redundancy allocation algorithm may define different repair field sizes for different memory arrays 301 within a memory system, or for different memory banks within a memory array 301. The row fuse array 302 may accommodate different repair field sizes for different banks within a memory array 301.

Figure 4:
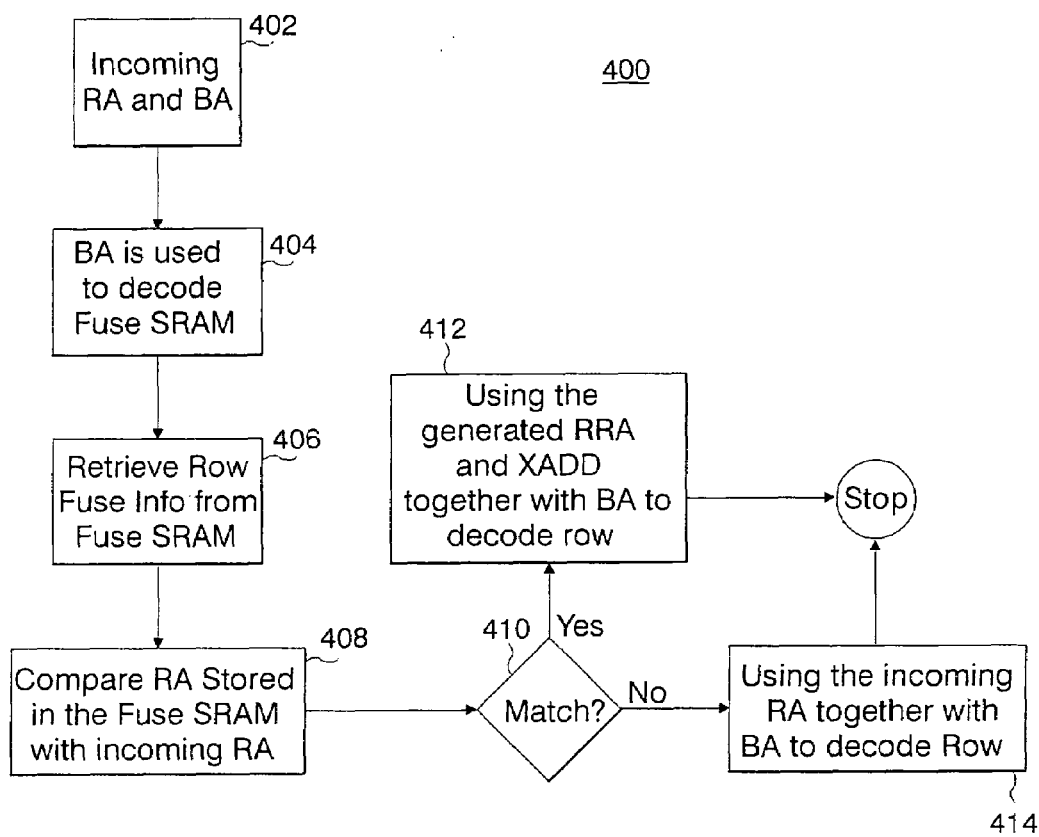
FIG. 4 is a flow chart of a method for repairing wordlines of a memory macro in accordance with the present invention.

FIG. 4 shows a flowchart 400 illustrating the operational steps of the row redundancy circuit 300. At step 402 the incoming RA and BA are provided. At step 404 the BA is decoded to access RFI stored in the storage cell 312 corresponding to the bank addressed by the BA. At step 406 the RFI is retrieved from the row fuse array 302. At step 408 the RFI is compared with the incoming RA by the RRCB 306. At step 410 the RRCB 306 determines if a match is found between the incoming RA and one of the addresses of the defective wordlines stored in the RFI. If a match is found, at step 412 the redundant row address RRA and control signal XADD are generated and provided together with the BA for accessing the desired row of the memory array 301. If no match is found, at step 414 the incoming RA together with the BA are used for accessing the desired row of the memory array 301.

Figure 5A:
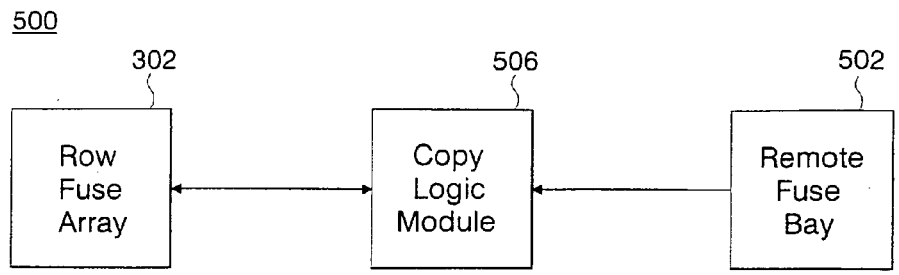
FIG. 5A is a block diagram of a programmable fuse domain system in accordance with the present invention.
Figure 5B:
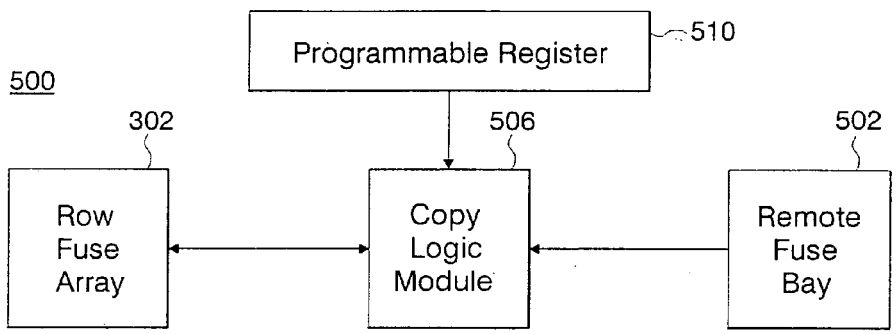
FIG. 5B is a block diagram of a programmable fuse domain system in accordance with another embodiment of the present invention.
Figure 5C:
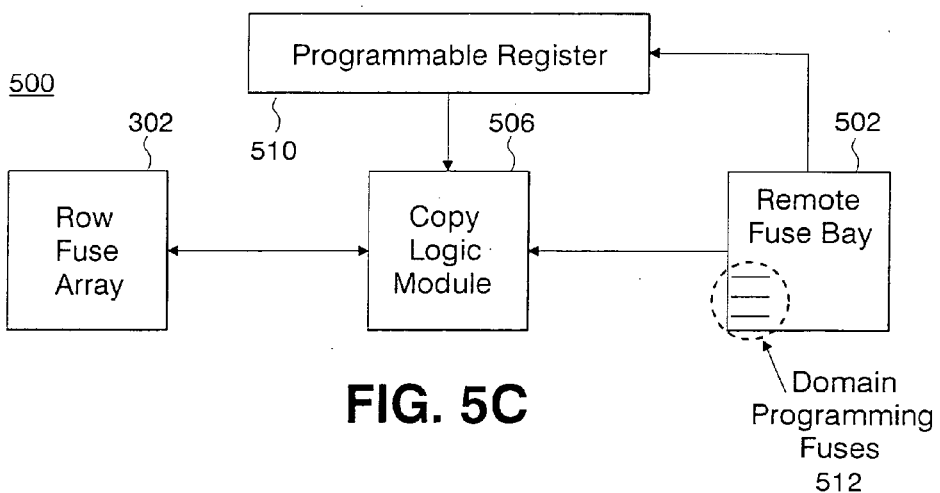
FIG. 5C is a block diagram of a programmable fuse domain system in accordance with still another embodiment of the present invention.

Programmable selection of the repair field size during power-on mode is shown in FIGS. 5A–C. In FIG. 5A, a first embodiment of a flexible row redundancy architecture system 500 in accordance with the present invention is shown, the row redundancy architecture system including a remote (off-chip) fuse bay 502, a copy logic module 506 and the row fuse array 302. During testing mode, addresses of faulty wordlines, e.g., failure bit addresses (FAB), corresponding to each repair field are stored in the remote fuse bay 502. The remote fuse bay 502 includes at least one set of fuse elements to record the failure address bits. These fuse elements can be programmed using laser or electrical means.

During power-on mode the FABs recorded by the fuse elements are copied by the copy logic module 506 using known copy logic algorithms into the row fuse array 302 as RFI. During the copy process the copy logic module 506 controls the row fuse array 302 for performing the copy process. The copy logic module 506 is programmed to copy the FABs into the row fuse array 302 in accordance with a predetermined repair field size, which determines how many copies of FABs corresponding to each repair field to copy into the row fuse array 302 as RFI.

For a repair field size selected to be 1M, the FABs for faulty wordlines corresponding to each repair field are copied eight times into the storage cells 312 corresponding to the eight respective banks of each repair field. For a repair field size selected to be ½M, the FABs for faulty wordlines corresponding to each repair field are copied four times into the storage cells 312 corresponding to the four respective banks of each repair field. For a repair field size selected to be ¼M, the FABs for faulty wordlines corresponding to each repair field are copied two times into the storage cells 312 corresponding to the two respective banks of each repair field.

The predetermined repair field size is selected manually or automatically in accordance with operator instructions and/or results from observations or computed analysis performed on testing results. The copy logic is programmed to implement the selected repair field size by known programming methods, such as by hard wiring. Programming of the copy logic module 506 may be performed during the test mode, where a redundancy analysis algorithm may be performed for determining the desired repair field size.

FIG. 5B shows a second embodiment of the flexible row redundancy architecture system 500 in accordance with the present invention. In the second embodiment, a programmable register 510 is provided. The repair field size is preprogrammed into the programmable register 510 for controlling the copy logic module 506 to copy the FABs corresponding to each faulty wordline the appropriate number of times in accordance with the preprogrammed field size repair field size. The programmable register 510 is programmed with the selected repair field size manually or automatically in accordance with operator instructions and/or results from observations or computed analysis performed on testing results. Preferably, the programmable register 510 may be reprogrammed, if desired, so that it may be used with different memory chips in which different repair field sizes are desired. Programming of the programmable register 510 may be performed during the test mode.

FIG. 5C shows a third embodiment of the flexible row redundancy architecture system 500 in accordance with the present invention. In the third embodiment the repair field size is preprogrammed into the remote fuse bay 502. In the example shown in FIG. 5C, the remote fuse bay 502 is programmed by programming at least one programmable fuse 512. During the power-on mode the preprogrammed repair field size is scanned from the remote fuse bay 402 into the programmable register 510 for setting the programmable register 510 to determine how many copies of FABs corresponding to each faulty wordline should be copied into the row fuse array 302.

The remote fuse bay 502 is programmed with the selected repair field size manually or automatically in accordance with operator instructions and/or results from observations or computed analysis performed on testing results. Programming of the remote fuse bay 502 may be performed during the test mode.

Thus, during testing mode for testing a memory chip different repair field sizes may be selected for different banks of a memory array 301 and/or different repair field sizes may be selected for different memory arrays 301 of the memory chip. During power-on mode the selected repair field size is used to control the copy logic module 506 for determining how many copies of FABs corresponding to each faulty wordline to copy into the row fuse array 302 associated with each memory array, where the row fuse array 302 is preferably an SRAM array. During operation of the memory arrays 301 of the memory chip row redundancy operation is performed similar to conventional row redundancy operation.

What has been described herein is merely illustrative of the application of the principles of the present invention. For example, the systems described above and implemented as the best mode for operating the present invention are for illustration purposes only. As a particular example, for instance, other design configurations may be used for the row fuse array, row redundancy comparator, copy logic module, remote fuse bay or the programmable register which provide similar operation as the system described herein. In other words, other arrangements and methods may be implemented by those skilled in the art and are contemplated to be within the scope of the appended claims.

We claim:

1. A redundancy system for replacing elements of a memory array having a plurality of banks, the redundancy system comprising:
   a memory chip including one or more memory arrays, each of the memory arrays including a row having M banks, each of the M banks including a plurality of elements;
   a plurality of wordline groups, each wordline group traversing N banks of the M banks of a row of the memory array and containing a plurality of wordlines, where M>N>1 and a repair field size is selectable and is defined by $M/N=2^P$, where M, N, and p are positive integers;
   a remote fuse bay for storing at least one faulty address corresponding to a faulty element of the memory array;
   a fuse ray for storing fuse information corresponding to at least one bank of the memory array; and
   a copy logic module for copying at least one faulty address stored in the remote fuse bay into the fuse array;
   wherein the copy logic module is programmed to copy the at least one faulty address N times into the fuse information corresponding to a repair field of the memory array, N corresponding to the number of banks in selectable repair field.

2. The redundancy system according to claim 1, wherein the element is a wordline, the fuse information is row fuse information, and the fuse array is a row fuse array.

3. The redundancy system according to claim 1, wherein the copy logic module is further programmed to copy the at least one faulty address into the fuse information corresponding to each bank of a repair field determined based on the selectable repair field size.

4. The redundancy system according to claim 1, wherein the copy logic module is preprogrammed based on a selected repair field size.

5. The redundancy system according to claim 1, further comprising a programmable register that is programmed based on the selectable repair field size to program the copy logic module.

6. The redundancy system according to claim 5, wherein the remote fuse bay is programmed based on the selectable repair field size to program the programmable register.

7. The redundancy system according to claim 1, wherein the selectable repair field size is selected during a testing mode of the memory array.

8. The redundancy system according to claim 1, wherein the fuse array is an SRAM array.

9. The redundancy system according to claim 1, wherein fuse information corresponding to more than one memory array is stored in the fuse array.

10. The redundancy system according to claim 9, wherein the repair field size is programmable for different memory arrays.

11. The redundancy system according to claim 1, wherein a different repair field size is selected for different banks of the memory array.

12. The redundancy system according to claim 1, wherein the system further comprises an error correction code block for receiving fuse information corresponding to the bank addressed by the received bank address, and for checking and correcting the received fuse information for soft errors; wherein the fuse array recieves a bank address for performing an operation on the memory array.

13. A redundancy system for replacing elements of a memory array having a plurality of banks, the redundancy system comprising:
- a semiconductor memory chip including one or more memory arrays, each of the memory arrays including M blanks;
- a plurality of wordline groups, each wordline group corresponding to a unique repair field and being shared by N banks of the M banks for each array, included in a repair field is determined by $M/N=2^P$ where M, N, and p are positive integers;
- a remote fuse bay storing at least one faulty address corresponding to a faulty element of the memory array;
- a fuse array for storing fuse information corresponding to at least one bank of the memory array;
- a copy logic module for copying at least one faulty address stored in the remote fuse bay into the fuse information corresponding to a repair field into the fuse array, said copy logic module programmed to copy the fuse information corresponding to a field based on the size of a selectable repair field, said size of said selectable repair field programmed during a power-on mode of said memory array, and to copy the at least one faulty address into the fuse information corresponding to a repair field N times, N corresponding to the number of banks in the selectable repair field; and
- a programmed register that is programmed based on the size of the selectable repair field to program the copy logic module.

14. The redundancy system according to claim 13, wherein the fuse array is an SRAM array.

15. The redundancy system according to claim 13, wherein fuse information corresponding to more than one memory array is stored in the fuse array.

* * * * *